US010043698B2

(12) United States Patent
Ota et al.

(10) Patent No.: US 10,043,698 B2
(45) Date of Patent: Aug. 7, 2018

(54) TRANSPORT SYSTEM AND TRANSPORT METHOD

(71) Applicant: MURATA MACHINERY, LTD., Kyoto-shi, Kyoto (JP)

(72) Inventors: Tatsuji Ota, Inuyama (JP); Masazumi Fukushima, Inuyama (JP); Yasuhisa Ito, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 177 days.

(21) Appl. No.: 14/944,442

(22) Filed: Nov. 18, 2015

(65) Prior Publication Data

US 2016/0071754 A1    Mar. 10, 2016

Related U.S. Application Data

(63) Continuation of application No. 13/283,630, filed on Oct. 28, 2011, now Pat. No. 9,263,311.

(30) Foreign Application Priority Data

Nov. 4, 2010   (JP) .................................. 2010-247553
Aug. 30, 2011  (JP) .................................. 2011-187120

(51) Int. Cl.
| | |
|---|---|
| *H01L 21/677* | (2006.01) |
| *B65G 1/04* | (2006.01) |
| *B66C 19/00* | (2006.01) |
| *H01L 21/67* | (2006.01) |

(52) U.S. Cl.
CPC ...... *H01L 21/67733* (2013.01); *B65G 1/0457* (2013.01); *B65G 1/0464* (2013.01); *B66C 19/00* (2013.01); *H01L 21/67259* (2013.01); *H01L 21/67706* (2013.01); *H01L 21/67724* (2013.01); *H01L 21/67736* (2013.01); *H01L 21/67769* (2013.01); *B65G 2201/0297* (2013.01)

(58) Field of Classification Search
CPC ...................... H01L 21/6773; H01L 21/67733
USPC ......................................... 414/281, 626, 940
See application file for complete search history.

(56) References Cited

U.S. PATENT DOCUMENTS

| | | | | |
|---|---|---|---|---|
| 8,915,690 | B2* | 12/2014 | Ota ................... | H01L 21/67733 414/275 |
| 2006/0182553 | A1* | 8/2006 | Yamamoto ......... | B65G 47/5104 414/278 |

(Continued)

OTHER PUBLICATIONS

Ota et al., "Transport System and Transport Method", U.S. Appl. No. 13/283,630, filed Oct. 28, 2011.

*Primary Examiner* — Jonathan Snelting
(74) *Attorney, Agent, or Firm* — Keating & Bennett, LLP (57) ABSTRACT

In a transport system, a local track is disposed so as to be below an overhead travelling vehicle track in parallel or substantially in parallel therewith, and furthermore above a loading port of a processing device from upstream of the loading port to downstream of the loading port. A local vehicle including a hoist travels along the local track. Below the local track, a first buffer is disposed upstream of the loading port of the processing device, and a second buffer is disposed downstream of the loading port of the processing device, and the overhead travelling vehicle and the local vehicle can both perform delivery and receipt of the article with the first buffer and the second buffer.

9 Claims, 5 Drawing Sheets

(56) References Cited

U.S. PATENT DOCUMENTS

| | | | | |
|---|---|---|---|---|
| 2008/0014061 A1* | 1/2008 | Izumi | ................ | H01L 21/67766 414/281 |
| 2008/0168920 A1* | 7/2008 | Nakashima | .......... | B65G 1/0457 104/124 |
| 2009/0081009 A1* | 3/2009 | Yamamoto | ........ | H01L 21/67775 414/222.08 |
| 2010/0003111 A1* | 1/2010 | Yeo | ................... | H01L 21/67775 414/222.07 |
| 2012/0263562 A1* | 10/2012 | Mizokawa | ........ | H01L 21/67733 414/618 |

* cited by examiner

TRANSPORT SYSTEM AND TRANSPORT METHOD

BACKGROUND OF THE INVENTION

1. Field of the Invention

The present invention relates to a transport system, and in particular to a transport system that supplies and removes articles without causing a processing device to wait.

2. Description of the Related Art

There is a need for articles such as FOUPs (sealed cassettes for transporting semiconductor wafers) to be supplied to and removed from the loading ports of devices such as a semiconductor machining device and a semiconductor inspection device without causing such devices to wait. In view of this need, it has been proposed to provide a buffer in the vicinity of a processing device, and provide an additional transport device for performing transport between the buffer and the processing device. For example, in JP 2006-224944A, multiple overhead travelling vehicle tracks are disposed in parallel in a ceiling space, one of which is used for long-distance transport, and another of which is used for short-distance transport. A buffer is disposed under the track for long-distance transport, and the loading port of a processing device is disposed under the track for short-distance transport. The overhead travelling vehicle for long-distance transport performs the delivery and receipt of articles with the buffer, and the overhead travelling vehicle for short-distance transport performs the delivery and receipt of articles between the buffer and the loading port. Accordingly, if articles required by the processing device have been transported to the buffer in advance, the articles can be quickly supplied to the processing device. Also, the overhead travelling vehicle for short-distance transport quickly removes articles from the loading port of the processing device. However, this configuration requires providing tracks at the same height position in parallel, thus increasing the floor space occupied by the transport system in a plan view.

In JP 2005-150129A, a buffer including a transport device is provided in front of a processing device, an overhead travelling vehicle performs the delivery and receipt of articles with the buffer, and the transport device of the buffer performs the delivery and receipt of articles with the loading port. However, a display for indicating the operation state, an operation panel for manual operation, and the like are provided on the front surface of the processing device, and it is not preferable for them to be blocked by the buffer. Also, the loading port is used not only by an automatic transport device, but also for manual supply and removal of articles, and manual access is difficult if the front surface of the processing device is covered by the buffer.

SUMMARY OF THE INVENTION

Preferred embodiments of the present invention provide a transport system and method that swiftly supply articles to and remove articles from a processing device without blocking the front surface of the processing device, while significantly reducing the amount of floor space occupied by the transport system in a plan view.

In addition, preferred embodiments of the present invention minimize the amount of lifting/lowering when the delivery and receipt of articles is performed with a buffer.

Furthermore, preferred embodiments of the present invention reduce and minimize the transport distance between a buffer and a loading port.

Additionally, preferred embodiments of the present invention provide a specific configuration in which an overhead travelling vehicle performs the delivery and receipt of articles with a buffer without interference with a local vehicle.

Various preferred embodiments of the present invention provide a transport system including, in order to transport an article between a plurality of processing devices, an overhead travelling vehicle track that passes above loading ports of the processing devices, and an overhead travelling vehicle that travels in one direction along the overhead travelling vehicle track and includes a hoist.

This system according to a preferred embodiment of the present invention includes a local track that is disposed so as to be below the overhead travelling vehicle track and above a loading port of a processing device from upstream of the loading port to downstream of the loading port along the one direction, and is disposed in parallel or substantially in parallel with the overhead travelling vehicle track; a local vehicle that travels along the local track and includes a hoist that lifts and lowers an article; a first buffer that is disposed so as to be below the local track and upstream of the loading port of the processing device along the one direction, the overhead travelling vehicle and the local vehicle both being able to perform delivery and receipt of an article with the first buffer; and a second buffer that is disposed so as to be below the local track and downstream of the loading port of the processing device along the one direction, the overhead travelling vehicle and the local vehicle both being able to perform delivery and receipt of an article with the second buffer.

According to this configuration of a preferred embodiment of the present invention, the space where the overhead travelling vehicle travels and the space where the local vehicle travels can be vertically overlapped with each other, thus enabling a significant reduction in the amount of floor space occupied by the transport system in a plan view. Also, the front surface of the processing device is not blocked by a buffer. Since the first buffer and the second buffer are provided upstream and downstream of the loading port, the local vehicle can swiftly perform the supply and removal of articles between the loading port and the buffers. The processing device may be provided with only one loading port or multiple loading ports. In the case of providing multiple loading ports, the local track is provided from upstream of the loading ports to downstream of the loading ports, the first buffer is provided upstream of the loading ports, and the second buffer is provided downstream of the loading ports.

Another preferred embodiment of the present invention relates to a transport system for addition on to an existing overhead travelling vehicle system. This system preferably includes a local track that is disposed so as to be below an overhead travelling vehicle track and above a loading port of a processing device from upstream of the loading port to downstream of the loading port along one direction, and is disposed in parallel or substantially in parallel with the overhead travelling vehicle track; a local vehicle that travels along the local track and includes a hoist that lifts and lowers an article; a first buffer that is disposed so as to be below the local track and upstream of the loading port of the processing device along the one direction, an overhead travelling vehicle and the local vehicle both being able to perform delivery and receipt of an article with the first buffer; and a second buffer that is disposed so as to be below the local track and downstream of the loading port of the processing device along the one direction, the overhead travelling vehicle and the local vehicle both being able to perform delivery and receipt of an article with the second buffer.

This enables the transport system including the local track, the local vehicle, and the first and second buffers to be added on to an existing overhead travelling vehicle system. Also, the add-on transport system does not require processing device modification, and even when applied to an existing overhead travelling vehicle system, the add-on transport system only requires modification for the shared use of struts. Also, the space where the overhead travelling vehicle travels and the space where the local vehicle travels can be vertically overlapped with each other, thus preventing the front surface of the processing device from being blocked by the buffers. Since the first buffer and the second buffer are provided upstream and downstream of the loading port, the local vehicle can swiftly perform the supply and removal of articles between the loading port and the buffers.

Preferably, the first buffer and the second buffer are each configured such that one article can be placed thereon. This enables disposing of a total of two buffers respectively upstream and downstream of the loading port, while being adjacent to the loading port.

Preferably, the first buffer and the second buffer are each disposed at a height according to which the local vehicle supporting an article may travel only above the first buffer without an article and the second buffer without an article, and the local vehicle not supporting an article may travel the first buffer both with an article and without an article and the second buffer both with an article and without an article. This enables the local vehicle to swiftly transport articles to and from the buffers.

Also, preferably, the first buffer and the second buffer each have a two-level stepped structure including an upper level and a lower level, and one article can be placed on each of the upper level and the lower level of the first buffer and the second buffer, the lower level is disposed on a side close to the loading port, the upper level is disposed on a side distant from the loading port, and regardless of whether an article has been placed on the lower level, the local vehicle can pass above the lower level when the local vehicle is supporting an article and when the local vehicle is not supporting an article, and the upper level is disposed at a height according to which the local vehicle supporting an article may travel only above the upper level without an article, and the local vehicle not supporting an article may travel above the upper level both with an article and without an article. This enables disposing of buffers with a total capacity of four articles upstream and downstream of the loading port, and furthermore enables the local vehicle to swiftly transport articles to and from the upper level buffer.

Also, preferably, the local track includes two parallel or substantially parallel rails with a gap in-between through which an article can pass in a vertical direction provided between the two rails. According to this configuration, even if the local track is disposed under the first track, the overhead travelling vehicle can perform the delivery and receipt of articles between the loading port and the buffers.

Preferably, the overhead travelling vehicle delivers an article to the first buffer and the second buffer and removes an article from the loading port, and the local vehicle delivers an article from the first buffer and the second buffer to the loading port. This control is executed by, for example, a controller of the overhead travelling vehicle and a controller of the local vehicle. According to this configuration, articles are swiftly transported from the loading port, and the overhead travelling vehicle can drop off articles at the buffers regardless of whether an article is placed on the loading port. Then, if the loading port is empty, an article can be swiftly delivered from a buffer to the loading port.

Preferably, the first buffer and the second buffer are supported by a horizontal frame disposed above the loading port, and the frame is provided with a look-down sensor to detect an interfering object on the loading port side. Due to the look-down sensor, the overhead travelling vehicle and the local vehicle do not interfere with, for example, a person on the loading port side. Here, the "loading port side" refers to the vicinity or the neighborhood of the loading port.

Also, a transport system according to a further preferred embodiment of the present invention is a transport system including a local track that is disposed so as to be below the overhead travelling vehicle track and above a loading port, and is disposed in parallel or substantially in parallel with the overhead travelling vehicle track; a local vehicle that travels along the local track and includes a hoist that lifts and lowers an article; and a two-level stepped buffer including an upper level and a lower level, one article being able to be placed on each of the upper level and the lower level, the lower level being disposed on a side close to the loading port, the upper level being disposed on a side distant from the loading port, and regardless of whether an article has been placed on the lower level, the local vehicle being able to pass above the lower level when the local vehicle is supporting an article and when the local vehicle is not supporting an article, and the upper level being disposed at a height according to which the local vehicle supporting an article may travel only above the upper level without an article, and the local vehicle not supporting an article may travel above the upper level both with an article and without an article.

Figure 1:
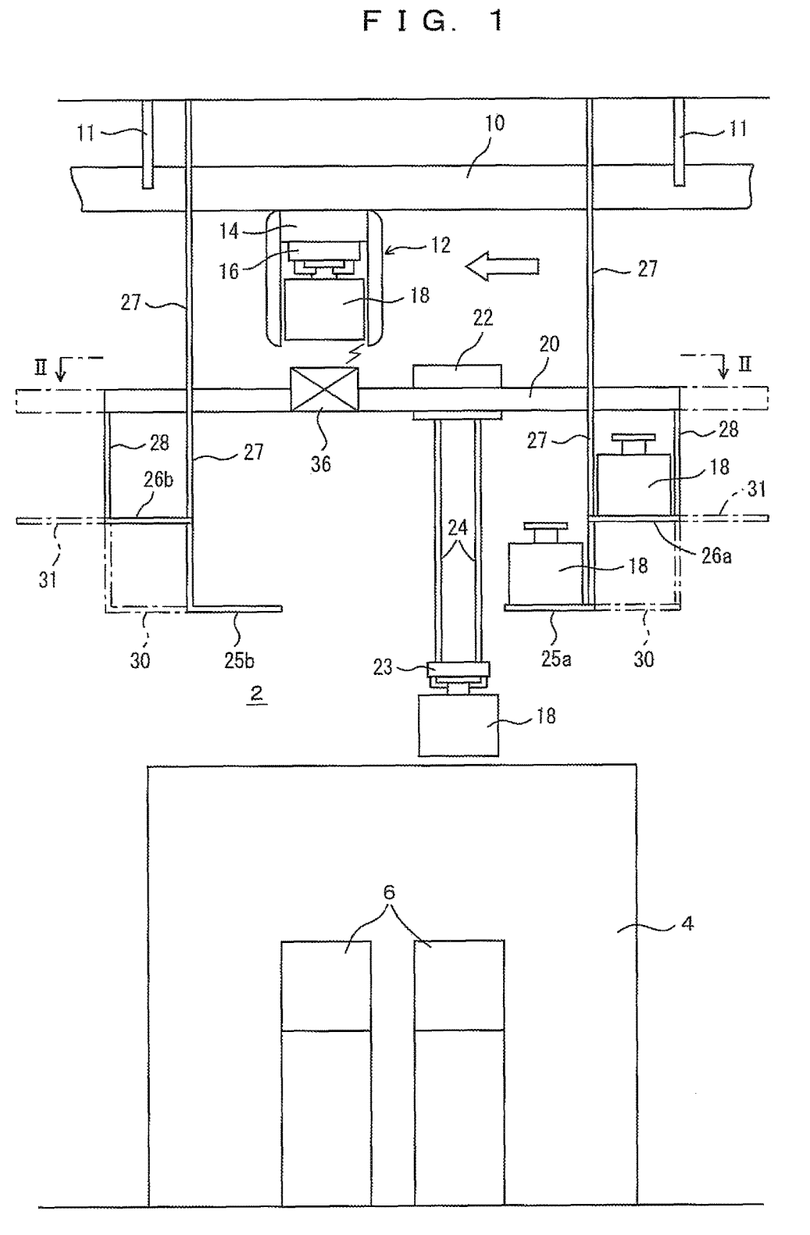
FIG. 1 is a side view of relevant portions of a transport system according to a preferred embodiment of the present invention.

As an example of a stepped buffer, at least either the combination of buffers 25a and 26a or the combination of buffers 25b and 26b shown in FIG. 1 is provided.

According to this configuration, the space where the overhead travelling vehicle travels and the space where the local vehicle travels can be vertically overlapped with each other, thus enabling a significant reduction in the amount of floor space occupied by the transport system in a plan view. Also, the front surface of the processing device is not blocked by a buffer. Also, since the buffers are arranged in a stepped fashion, namely in an upper level and a lower level, the overhead travelling vehicle and the local vehicle can span access both the upper and lower levels, and since the height level difference between the local track and the upper level buffer is small, articles can be supplied to and removed from the upper level buffer with a small amount of lifting/lowering.

Also, a transport method according to yet another preferred embodiment of the present invention is a transport method for transporting an article to a loading port of a processing device using an overhead travelling vehicle track that passes above the loading port and an overhead travelling vehicle that travels in one direction along the overhead travelling vehicle track and includes a hoist, a local track is disposed so as to be below the overhead travelling vehicle track and above the loading port of the processing device from upstream of the loading port to downstream of the loading port along the one direction, and is disposed in parallel or substantially in parallel with the overhead travelling vehicle track, a local vehicle travels along the local track and includes a hoist that lifts and lowers an article, a first buffer is disposed so as to be below the local track and upstream of the loading port of the processing device along the one direction, the overhead travelling vehicle and the local vehicle both being able to perform delivery and receipt of an article with the first buffer, and a second buffer is disposed so as to be below the local track and downstream of the loading port of the processing device along the one direction, the overhead travelling vehicle and the local vehicle both being able to perform delivery and receipt of an article with the second buffer.

The transport method includes a step performed by the overhead travelling vehicle for dropping off an article at the first buffer or the second buffer; a step performed by the local vehicle for dropping off an article from the first buffer or the second buffer at the loading port; and a step performed by the overhead travelling vehicle for removing an article from the loading port.

According to this configuration, articles are swiftly transported from the loading port, and the overhead travelling vehicle can drop off articles at the buffers regardless of whether an article is placed on the loading port. Then, if the loading port is empty, an article can be swiftly delivered from a buffer to the loading port.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes various preferred embodiments of the present invention. The scope of the present invention is based on the claims, and is intended to be determined in accordance with the understanding of a person skilled in the art with reference to the description of various preferred embodiments of the present invention and related art in the field of the present invention.

FIGS. 1 to 5 show a transport system according to preferred embodiments and variations thereof. In these figures, reference numeral 2 denotes a transport system, and reference numeral 4 denotes a processing device, examples of which include a semiconductor processing device and a semiconductor inspection device. The transport system 2 is preferably provided in a clean room, for example. The processing device 4 includes one or more loading ports 6, and a track 10 for an overhead travelling vehicle 12 is provided over the loading ports 6 by being supported from the ceiling by struts 11. The overhead travelling vehicle 12 includes a hoist 14, which lifts and lowers an elevation platform 16 together with articles 18. Here, the articles 18 preferably are FOUPs accommodating a semiconductor wafer, for example, but the articles 18 may be of any type. In addition to the hoist 14, the overhead travelling vehicle 12 may also include, for example, a device that transversely feeds of the hoist 14 and a device that pivots the hoist 14 about a vertical axis. The track 10 and the overhead travelling vehicle 12 configure an overhead travelling vehicle system, and this system itself is well-known.

Local tracks 20 are provided under the track 10, for example, and one local track 20 is preferably provided for each processing device, for example. Although a local track 20 is provided in a range including the region over the loading ports 6 and regions on both the left and right thereof, for example, a local track 20 may be provided in a range including the region over the loading ports 6 and a region on either the left or right thereof. Reference numeral 22 denotes a local vehicle that moves back and forth along the local track 20 and lifts and lowers an elevation platform 23 via suspending members 24 such as belts, wires, or ropes, for example. Two types of buffers 25a and 25b, and 26a and 26b are provided, for example, in front of and behind the loading ports 6 in terms of the travelling direction of the local vehicle 22. The overhead travelling vehicle 12 travels in the direction indicated by the arrow in FIG. 1, and for example, the buffers 25a and 26a upstream of the pair of loading ports 6 configure a first buffer, and the buffers 25b and 26b downstream of the pair of loading ports 6 configure a second buffer.

The buffers 25a and 25b are provided at a height position according to which the local vehicle 22 can pass over the buffers 25a and 25b without interference when the local vehicle 22 is supporting an article 18, and are provided at positions adjacent to the loading ports 6 in a plan view. In other words, a height difference greater than the height of one article 18 is provided between the bottom surface of the article 18 supported by the local vehicle 22 and the article placement surface of the buffers 25a and 25b. The buffers 26a and 26b configure the second buffer, and are provided on sides of the buffers 25a and 25b opposite to the loading ports 6. The buffers 26a and 26b are provided at a height according to which the local vehicle 22 can travel over the buffers 26a and 26b when the local vehicle 22 is not supporting an article 18, and the local vehicle 22 cannot travel over the buffers 26a and 26b when the local vehicle 22 is supporting an article 18. In other words, the height difference between the bottom surface of the article 18 supported by the local vehicle 22 and the article placement surface of the buffers 26a and 26b is less than or equal to the height of one article 18. For example, the buffers 26a and 26b are provided at a height position that is higher than that of the buffers 25a and 25b by the height of one article 18, thus configuring a one-level level difference between the buffers 25a and 25b and the buffers 26a and 26b. Also, the buffers 25a and 25b and the buffers 26a and 26b are supported by struts 27 and 28, and although the struts 27 are also used as struts for the local track 20, for example, the struts 27 may be separate from the struts for the local track 20.

Although the buffers 25a and 25b and the buffers 26a and 26b are provided on both the left and right of the loading ports 6 (both in front of and behind the loading ports 6 in terms of the travelling direction of the overhead travelling vehicle 12) in the present preferred embodiment, such buffers may be provided on only either the left or the right. If the buffer capacity is insufficient, a configuration is possible in which, as shown by the chain lines in FIG. 1, the buffers 26a and 26b are moved to the positions of buffers 31, and buffers 30 are provided below the original positions of the buffers 26a and 26b. In this case, the local track 20 is also extended to the regions over the buffers 31.

If the buffers 25a, 25b, 26a, 26b, and the like are disposed as described above, the overhead travelling vehicle 12 and the local vehicle 22 can deliver articles 18 to and receive articles 18 from any of the buffers 25a, 25b, 26a, and 26b. Since the buffers 25a and 25b are at a low position, they can be freely accessed by the overhead travelling vehicle 12 and the local vehicle 22, but the amount of lifting/lowering during the delivery and receipt of the articles 18 is high. If the buffers 26a and 26b are empty, they can be accessed by the load-bearing local vehicle 22 and the load-bearing overhead travelling vehicle 12. If articles 18 have been placed on the buffers 26a and 26b, they can be accessed by the non-load-bearing local vehicle 22 and the non-load-bearing overhead travelling vehicle 12. Note that the overhead travelling vehicle 12 lifts and lowers the articles 18 via a gap in the local track 20, which includes a pair of travelling rails, and the mechanism for achieving this will be described later.

As a result, the buffers 25a, 25b, 26a, and 26b can be accessed by the local vehicle 22 and the overhead travelling vehicle 12. Since the buffers 26a and 26b are at a higher position than the buffers 25a and 25b, the movement time of the overhead travelling vehicle 12 and the local vehicle 22 can be shortened. Particularly with the local vehicle 22, the amount of lifting/lowering during the movement of articles 18 is low, and the movement time can be shortened. Also, since the buffers 25a, 25b, 26a, and 26b are placed in the vicinity of the loading ports 6, the local vehicle 22 can transport articles 18 between the loading ports 6 and the buffers 25a, 25b, 26a, and 26b in a short time.

Figure 2:
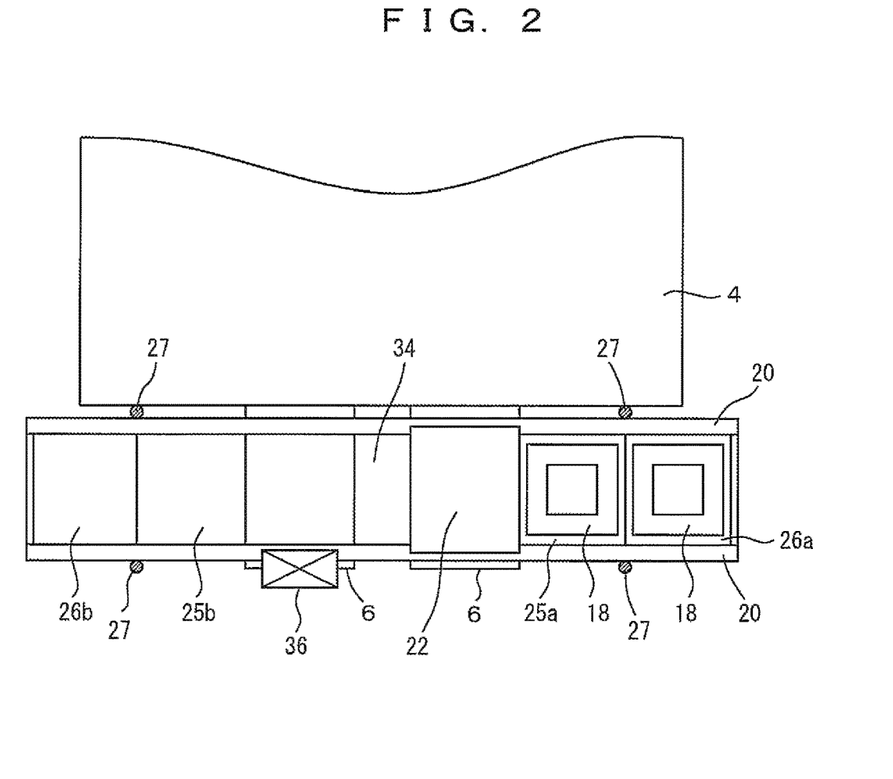
FIG. 2 is a plan view of relevant portions showing a state in which travelling rails of an overhead travelling vehicle have been removed from the transport system according to a preferred embodiment of the present invention.

FIG. 2 is a view looking downward along the line II-II in FIG. 1, and the transport system 2 is shown without the overhead travelling vehicle 12 and the track 10. As shown in FIG. 2, the local track 20 preferably includes a pair of rails, and a gap 34 is provided between the rails. The width of the gap 34 is greater than the depth of the articles 18, and the articles 18 can pass through the gap 34 in the vertical direction. Also, a charging device 36 that charges the local vehicle 22 is provided above a loading port 6. Although the charging device 36 is preferably disposed over one of the loading ports 6 in FIGS. 1 and 2, the charging device 36 may be disposed above the other loading port, between the pair of loading ports 6, or the like.

Except for the case of an article needed immediately by a processing device 4, the overhead travelling vehicle 12 drops off articles 18 on the buffers 25a, 25b, 26a, and 26b. Also, except for the case of an article needed immediately by the next processing device, the overhead travelling vehicle 12 removes articles from the buffers 25a, 25b, 26a, and 26b instead of removing articles from the loading ports 6. Also, the transport of articles between the loading ports 6 and the buffers 25a, 25b, 26a, and 26b is basically performed by the local vehicle 22. As a result, even if the local vehicle 22 stops above a loading port 6 for charging, there is no interference with the transport of articles by the overhead travelling vehicle 12. Note that the charging device 36 may be provided at, for example, a position facing the buffer 25a, 25b, 26a, or 26b. In this case, if the local vehicle 22 stops at that position for an extended time for charging, access to the buffer by the overhead travelling vehicle 12 is hindered.

Figure 3:
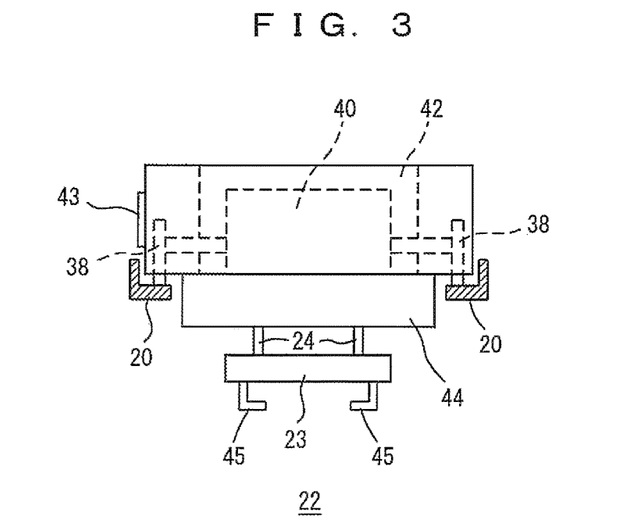
FIG. 3 is a front view of a structure of a local vehicle.

FIG. 3 shows the structure of the local vehicle 22, and in this figure, reference numerals 38 denote running wheels that are driven by a running motor 40, and reference numeral 42 denotes a battery that is charged by the charging device 36 via a power receiving device 43. In place of the battery, another power storage member such as a capacitor may be used, for example. Electricity may be supplied to the power receiving device 43 via, for example, non-contact electricity feeding or contact electricity feeding via a connector, a charging coupler, or the like. Reference numeral 44 denotes a hoist that lifts and lowers the elevation platform 23, and reference numerals 45 denote chucks that grab and release flanges at the top of the articles 18.

Figure 4:
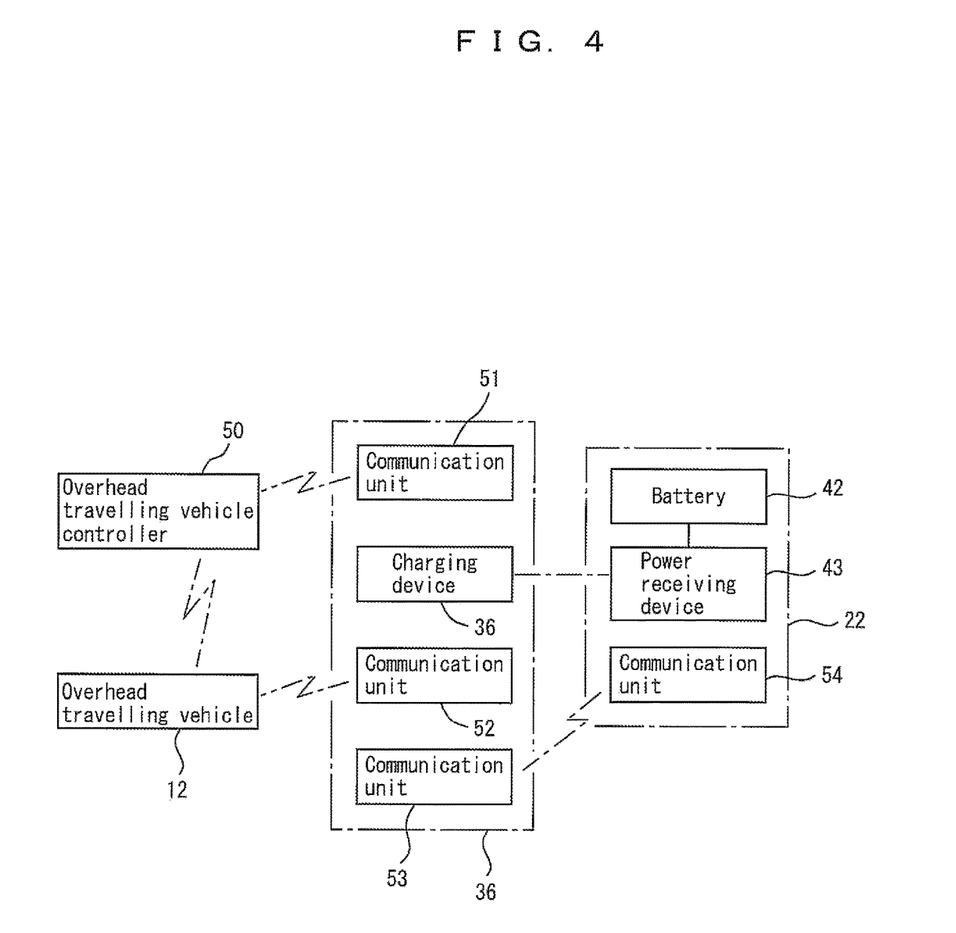
FIG. 4 is a diagram illustrating communication within the transport system.

FIG. 4 illustrates communication in the transport system, and an overhead travelling vehicle controller 50 communicates with the overhead travelling vehicle 12 and issues transport commands. For example, the charging device 36 also functions as a controller for the local vehicle 22, and by communicating with the overhead travelling vehicle controller 50 via a communication unit 51, the charging device 36 reports the presence or absence of articles 18 on the buffers 25a, 25b, 26a, and 26b, the IDs thereof, and the like to the overhead travelling vehicle controller 50. The charging device 36 also receives, from the overhead travelling vehicle controller 50, instructions regarding the transport of the articles 18 via the buffers 25a, 25b, 26a, and 26b. A communication unit 52 communicates with the overhead travelling vehicle 12, and performs interlocking when the overhead travelling vehicle 12 delivers articles 18 to and receives articles 18 from the buffers 25a, 25b, 26a, and 26b. A communication unit 53 communicates with a communication unit 54 of the local vehicle 22, and instructs the local vehicle 22 to move articles 18 between the buffers 25a, 25b, 26a, and 26b and the loading ports 6.

The following describes operations performed in the transport system 2. An operation performed by the transport system is to supply an article 18 to a loading port 6 exactly when the article 18 is required by the processing device 4, and to take an article 18 outside of the processing device 4 immediately when the article 18 is removed from the interior to the loading port 6. In order to achieve this, it is sufficient to provide a local vehicle 22 and buffers 25a, 25b, 26a, and 26b exclusively for the processing device 4. It is sufficient for articles 18 required by the processing device 4 to be held on the buffers 25a, 25b, 26a, and 26b in advance, and to transport the articles 18 to the loading ports 6 when they are required by the processing device 4. Also, it is sufficient for articles 18 that have been removed from the interior to the loading ports 6 to be immediately moved to the buffers 25a, 25b, 26a, and 26b by the local vehicle 22. Also, the transport of articles 18 to a position farther than the buffers 25a, 25b, 26a, and 26b is performed by the overhead travelling vehicle 12, which can also access any of the buffers 25a, 25b, 26a, and 26b, and can directly access the loading ports 6 as well in an urgent situation or the like.

There are cases where an article 18 required by the processing device 4 has not been placed on the buffer 25a, 25b, 26a, or 26b when it is required. In such a case, the waiting time of the processing device 4 can be shortened if the overhead travelling vehicle 12 can directly drop off articles 18 at the loading ports 6. Also, if the removal of an article required by the next processing device is delayed, the waiting time of the next processing device can be shortened if the overhead travelling vehicle 12 directly removes articles 18 from the loading ports 6.

The local vehicle 22 travels a short distance along the local track 20, and therefore needs only be a simple vehicle. Communication with the charging device 36 serving as a controller is performed by, for example, use of the local track 20 as a signal line, providing a feeder line along the local track 20, or performing radio communication between the vehicle 22 and the charging device 36. Also, the struts 27 and the like can be used to supply power to the charging device 36, and can be used as lines for communication with the overhead travelling vehicle controller 50.

Figure 5:
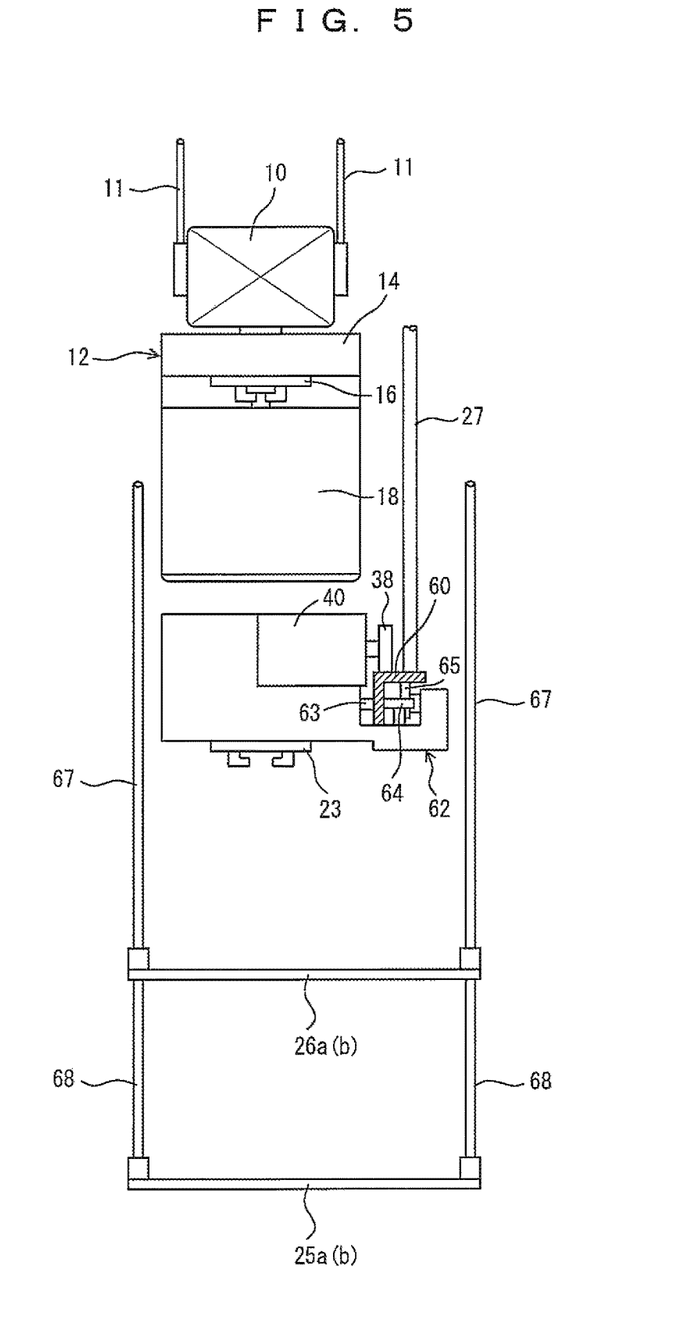
FIG. 5 is a front view of relevant portions of a transport system according to a variation of a preferred embodiment of the present invention.

Although the example of disposing the local track 20 preferably under the track 10 is described in the present preferred embodiment, there is no limitation to this. FIG. 5 shows an example in which the local track 20 is not disposed under the track 10, and in this figure, the same reference numerals as those in the above preferred embodiment denote the same constituent elements. Reference numeral 60 denotes a new local track that is disposed below the track 10 while not being directly under the track 10, and reference numeral 62 denotes a new local vehicle. The local vehicle 62 is supported by the local track 60 via guide rollers 63 to 65 and travels along the local track 60, reference numerals 67 and 68 denote new struts, and the other aspects of this variation are similar to the preferred embodiment shown in FIGS. 1 to 4.

Figure 6:
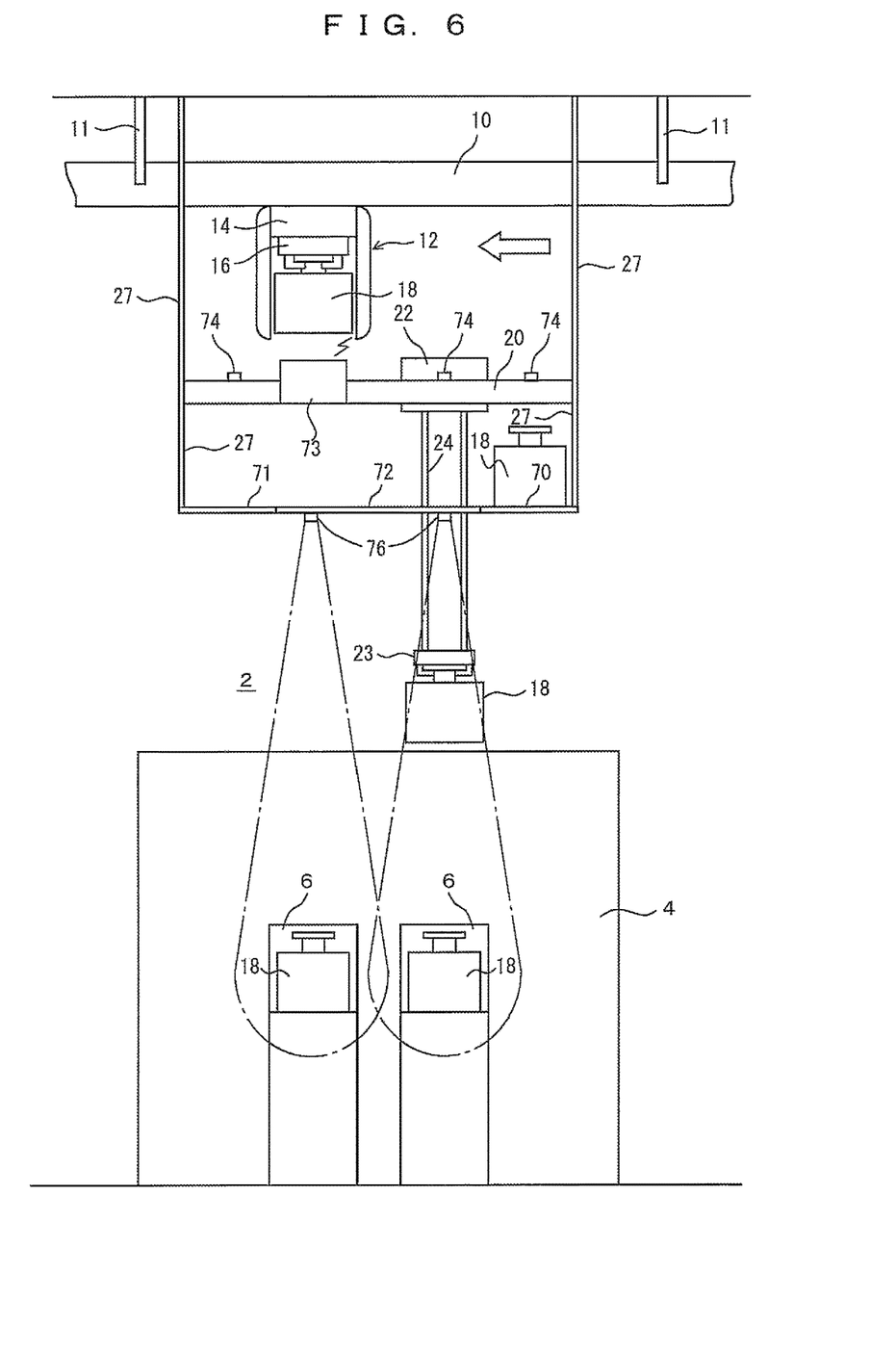
FIG. 6 is a side view of relevant portions of a transport system according to another preferred embodiment of the present invention.

FIG. 6 shows another preferred embodiment of the present invention. In FIG. 6, reference numerals that are the same as those in FIGS. 1 to 4 denote the same constituent elements, and aspects other than those particularly pointed out below are similar to the preferred embodiment shown in FIGS. 1 to 4. The overhead travelling vehicle 12 travels in one direction along the arrow shown in FIG. 6. The processing device 4 includes a pair of loading ports 6, for example, a first buffer 70 is provided upstream of the loading ports 6 in terms of the travelling direction of the overhead travelling vehicle 12, and a second buffer 71 is provided downstream of the loading ports 6 in terms of the travelling direction of the overhead travelling vehicle 12. Note that the number of loading ports 6 provided for each processing device 4 is arbitrary. The local track 20 extends from a region above the first buffer 70 upstream of the loading ports 6 to a region above the second buffer 71 downstream of the loading ports 6. Reference numeral 72 denotes a horizontal frame that is supported by the struts 27, and the frame 72 extends from the region above the loading ports 6 to regions on the left and right (upstream and downstream) thereof and supports the buffers 70 and 71. The buffers 70 and 71 are disposed at a height according to which the local vehicle 22 can travel over the buffers 70 and 71 when local vehicle 22 is not supporting an article 18, and the local vehicle 22 cannot travel over the buffers 70 and 71 when the local vehicle 22 is supporting an article 18.

In a plan view, the track 10, the track 20, and the buffers 70 and 71 overlap each other, and the loading ports 6 are under the tracks 10 and 20. The track 20 preferably includes two rails, and a gap is provided between the rails such that articles 18 can pass between the rails in the vertical direction. The local vehicle 22 stops at, for example, four stop positions along the track 20, a charging device 74 such as a charging coupler is provided at each of the stop positions, and the charging devices 74 charge a battery such as a lithium ion battery or a capacitor such as an electric double layer capacitor of the local vehicle. The local vehicle 22 can be charged each time it stops, and therefore can be driven with a low-capacity battery or a low-capacity capacitor. Note that a configuration is possible in which the charging devices 74 are provided at only positions over the buffers 70 and 71 since it is not suitable for the standby positions of the local vehicle 22 to be positions over the loading ports 6.

Reference numeral 73 denotes a controller that controls the local vehicle 22 and performs communication with the overhead travelling vehicle 12 or the overhead travelling vehicle controller 50 shown in FIG. 4. The frame 72 includes, for example, a pair of look-down sensors 76 above the loading ports 6, and the look-down sensors 76 monitor interfering objects such as workers in the vicinity of the loading ports 6. The look-down sensors 76 each include, for example, a laser beam source, a mechanism that scans the range indicated by chain lines in FIG. 6 by changing the orientation of a laser beam, and a photoreception element arranged to receive reflected light. The look-down sensors 76 monitor objects in the chain line ranges shown in FIG. 6, for example, and if an object is detected in a chain line range, the controller 73 prohibits transport between the corresponding loading port 6 and the local vehicle 22 and overhead travelling vehicle 12. Note that one look-down sensor 76 may monitor multiple loading ports 6. Also, the controller 73 may communicate with the overhead travelling vehicle 12 via the overhead travelling vehicle controller 50 shown in FIG. 4 instead of by direct communication.

The following describes operations performed in the present preferred embodiment. The overhead travelling vehicle 12 drops off (delivers) articles 18 on the buffers 70 and 71, and removes (picks up) articles 18 from the loading ports 6. If a free space is available on the buffer 70, and an article 18 is to be removed from the loading port 6, the overhead travelling vehicle 12 drops off a transported article 18 at the buffer 70, and removes the article 18 from the loading port 6. Accordingly, delivery and removal can be performed by a single overhead travelling vehicle 12. The local vehicle 22 delivers articles on the buffers 70 and 71 to the loading ports 6. The local vehicle 22 alternately changes its standby position above the buffers 70 and 71. For example, the local vehicle 22 waits above the buffer 70 after delivering an article on the buffer 71 to a loading port 6, and thus the local vehicle 22 can subsequently swiftly deliver an article on the buffer 70 to a loading port 6. Note that if no articles 18 are present on the buffers 70 and 71, the overhead travelling vehicle 12 may wait above the buffer 71 so as to be able to drop off an article 18 on the buffer 70. If there is the risk of an overflow of articles 18 at a loading port 6, the local vehicle 22 may remove an article from the loading port 6 and deliver it to the buffer 70 or 71. Also, in the case of an urgent article, the overhead travelling vehicle 12 may deliver an article directly to a loading port 6.

In the present preferred embodiment, the buffers 70 and 71 are preferably adjacent to the loading ports 6, and the height difference between the track 20 and the buffers 70 and 71 is small. Accordingly, the local vehicle 22 can deliver articles 18 from the buffers 70 and 71 to the loading ports 6 in a short time. From the viewpoint of the overhead travelling vehicle 12, it is as if the processing device 4 has two loading ports exclusively for removal, and two loading ports exclusively for delivery. This enables a significant reduction and minimization of the occurrence of the problem that an article 18 cannot be dropped off at a loading port 6. Also, from the viewpoint of the processing device 4, up to two articles to be processed can be stored on the buffers 70 and 71.

The above-described preferred embodiment achieves at least the following advantages.

The buffers 25a, 25b, 26a, and 26b can be provided without blocking the front surface of the processing devices 4.

The space where the overhead travelling vehicle 12 travels and the space where the local vehicle 22 travels can be vertically overlapped with each other, thus enabling significant reduction in the amount of floor space occupied by the transport system in a plan view.

The buffers 25a, 25b, 26a, and 26b are arranged in a two-level stepped fashion, namely in an upper level and a lower level, thus enabling the overhead travelling vehicle 12 and the local vehicle 22 to access any of the buffers 25a, 25b, 26a, and 26b. In particular, the height level difference between the local track 20 and the buffers 26a and 26b is small, thus enabling articles 18 to be supplied to and removed from the buffers 26a and 26b with a small amount of lifting/lowering.

Articles 18 can pass through the gap 34 provided in the local track 20, thus enabling the local track 20 and the buffers 25a, 25b, 26a, and 26b to be disposed under the track 10 for the overhead travelling vehicle 12.

It is possible to add on the transport system made up of the local track 20, the local vehicle 22, and the buffers 25a, 25b, 26a, and 26b with almost no modifications to the processing devices 4 and the existing overhead travelling vehicle system.

The local vehicle 22 moves back and forth along the short local track 20, thus enabling swiftly performing the supply and removal of articles between the loading ports 6 and the buffers 25a, 25b, 26a, and 26b. In particular, if the buffers 25a and 25b and the buffers 26a and 26b are provided in front of and behind the loading ports 6, a large number of the buffers 25a, 25b, 26a, and 26b can be provided in the vicinity of the loading ports 6.

If the charging device 36 is provided above a loading port 6, the battery 42 of the local vehicle 22 can be charged without hindering access to the buffers 25a, 25b, 26a, and 26b by the overhead travelling vehicle 12. Also, since the local vehicle 22 is driven using a battery, there is no need to provide the local track 20 with an electricity feeding rail.

Note that it is not necessary to provide all of the processing devices 4 with the system that includes the buffers 70 and 71, the local track 20, and the local vehicle 22. For example, it is possible to provide such a system for only processing devices 4 that process a large number of articles 18. The type of article 18 that is transported is arbitrary, and non-limiting examples thereof preferably include a cassette accommodating a semiconductor exposure reticle, and a flat panel display substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport system to transport articles among a plurality of processing devices, the transport system comprising:
   an overhead travelling vehicle track passing over loading ports of the plurality of processing devices;
   an overhead travelling vehicle travelling in one direction along the overhead travelling vehicle track and including a hoist;
   a local track disposed so as to be under and in parallel or substantially in parallel with the overhead travelling vehicle track and over a loading port of one of the processing devices from upstream of the loading port to downstream of the loading port along the one direction;
   a local vehicle travelling along the local track and including a hoist that lifts and lowers one of the articles;
   a first buffer disposed so as to be under the local track and upstream of the loading port of the one of the processing devices along the one direction, the overhead travelling vehicle and the local vehicle both arranged to deliver and receive one of the articles with the first buffer; and
   a second buffer disposed so as to be under the local track and downstream of the loading port of the one of the processing devices along the one direction, the overhead travelling vehicle and the local vehicle both arranged to deliver and receive one of the articles with the second buffer; wherein
   the first buffer and the second buffer are each arranged such that only one of the articles may be placed thereon;
   the first buffer and the second buffer are each disposed at a height according to which the local vehicle supporting one of the articles may travel only over the first buffer without any of the articles and the second buffer without any of the articles, and the local vehicle not supporting any of the articles may travel the first buffer both with one of the articles and without any of the articles and the second buffer both with the one of the articles and without any of the articles;
   the first buffer and the second buffer are each located at a position that is fixed, with respect to the local track, in a direction other than a vertical direction that is perpendicular to the one direction;
   in a plan view of the transport system, the first and second buffers are arranged to not overlap the loading port of the one of the processing devices in the vertical direction; and
   in a side view of the transport system, the first and second buffers are only provided either in front of or behind the loading port in the one direction.

2. The transport system according to claim 1, wherein the local track includes two parallel or substantially parallel rails with a gap in-between through which the articles can pass in the vertical direction.

3. The transport system according to claim 1, further comprising:
   a controller programmed to control the overhead travelling vehicle and the local vehicle such that the overhead travelling vehicle delivers one of the articles to the first buffer and the second buffer and removes the one of the articles from the loading port of the one of the processing devices, and the local vehicle delivers the one of the articles from the first buffer and the second buffer to the loading port.

4. The transport system according to claim 1, wherein the first buffer and the second buffer are fixed by a horizontal frame disposed above the loading port of the one of the processing devices, and the frame is provided with a lookdown sensor to detect an interfering object on the loading port side.

5. The transport system according to claim 1, further comprising:
   a controller programmed to control the overhead travelling vehicle and the local vehicle such that the overhead travelling vehicle drops off one of the articles at the first buffer or the second buffer, the local vehicle drops off the one of the articles from the first buffer or the second buffer at the loading port of the one of the processing devices, and the overhead traveling vehicle removes the one of the articles from the loading port.

6. The transport system according to claim 1, wherein a height difference between the first buffer and the local track in the vertical direction is the same or substantially the same as a height difference between the second buffer and the local track in the vertical direction.

7. The transport system according to claim 1, wherein, in a plan view of the transport system, the first and second buffers are arranged to not overlap any loading port in the vertical direction.

8. A transport system for addition on to an existing overhead travelling vehicle system, the transport system comprising:
- a local track that is disposed so as to be under an overhead travelling vehicle track and over a loading port of a processing device from upstream of the loading port to downstream of the loading port along one direction, and is disposed in parallel or substantially in parallel with the overhead travelling vehicle track;
- a local vehicle that travels along the local track and includes a hoist that lifts and lowers articles;
- a first buffer that is disposed so as to be under the local track and upstream of the loading port of the processing device along the one direction, an overhead travelling vehicle and the local vehicle both being arranged to perform delivery and receipt of one of the articles with the first buffer; and
- a second buffer that is disposed so as to be under the local track and downstream of the loading port of the processing device along the one direction, the overhead travelling vehicle and the local vehicle both being arranged to perform delivery and receipt of one of the articles with the second buffer; wherein
- the first buffer and the second buffer are each arranged such that only one of the articles may be placed thereon;
- the first buffer and the second buffer are each disposed at a height according to which the local vehicle supporting one of the articles may travel only over the first buffer without any of the articles and the second buffer without any of the articles, and the local vehicle not supporting any of the articles may travel the first buffer both with one of the articles and without any of the articles and the second buffer both with the one of the articles and without any of the articles;
- the first buffer and the second buffer are each located at a position that is fixed, with respect to the local track, in a direction other than a vertical direction that is perpendicular to the one direction;
- in a plan view of the transport system, the first and second buffers are arranged to not overlap the loading port of the processing device in the vertical direction; and
- in a side view of the transport system, the first and second buffers are only provided either in front of or behind the loading port in the one direction.

9. The transport system according to claim 8, wherein, in a plan view of the transport system, the first and second buffers are arranged to not overlap any loading port in the vertical direction.

* * * * *